United States Patent
Schön et al.

(10) Patent No.: US 7,612,627 B2
(45) Date of Patent: Nov. 3, 2009

(54) INTEGRATED BINARY PHASE SHIFT KEYING WITH SILICON MEMS RESONATORS

(75) Inventors: Florian Schön, München (DE); Wolfgang Raberg, Sauerlach (DE); Bernhard Winkler, München (DE)

(73) Assignee: Infineon Technologies AG, Neubiberg (DE)

( * ) Notice: Subject to any disclaimer, the term of this patent is extended or adjusted under 35 U.S.C. 154(b) by 94 days.

(21) Appl. No.: 11/863,534

(22) Filed: Sep. 28, 2007

(65) Prior Publication Data

US 2009/0085686 A1    Apr. 2, 2009

(51) Int. Cl.
*H04L 27/20* (2006.01)

(52) U.S. Cl. ..................................... 332/103

(58) Field of Classification Search .......... 332/103–105
See application file for complete search history.

(56) References Cited

U.S. PATENT DOCUMENTS 7,047,810 B2 *    5/2006    Kogan et al. .................. 73/702

\* cited by examiner

*Primary Examiner*—David Mis
(74) *Attorney, Agent, or Firm*—Eschweiler & Associates, LLC

(57) ABSTRACT

A modulator includes a micro-electromechanical resonator device configured to receive an input signal and generate two output signals in response thereto, wherein the two signals having a predetermined phase relationship therebetween. The modulator further includes a switching system configured to selectively pass one of the two signals to an output of the modulator in an alternating fashion in response to phase modulation data.

24 Claims, 4 Drawing Sheets

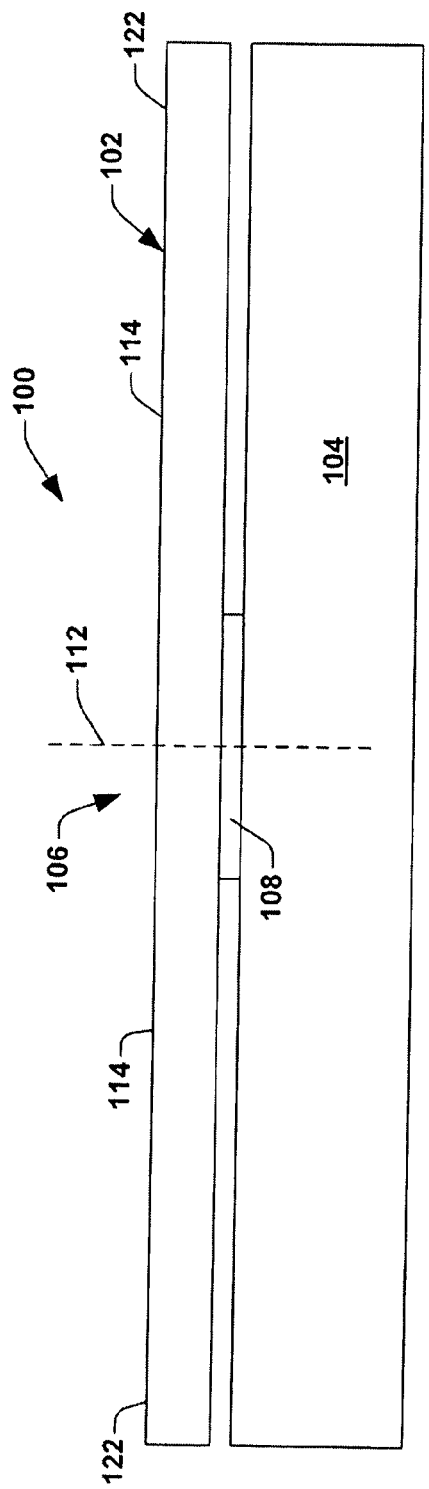
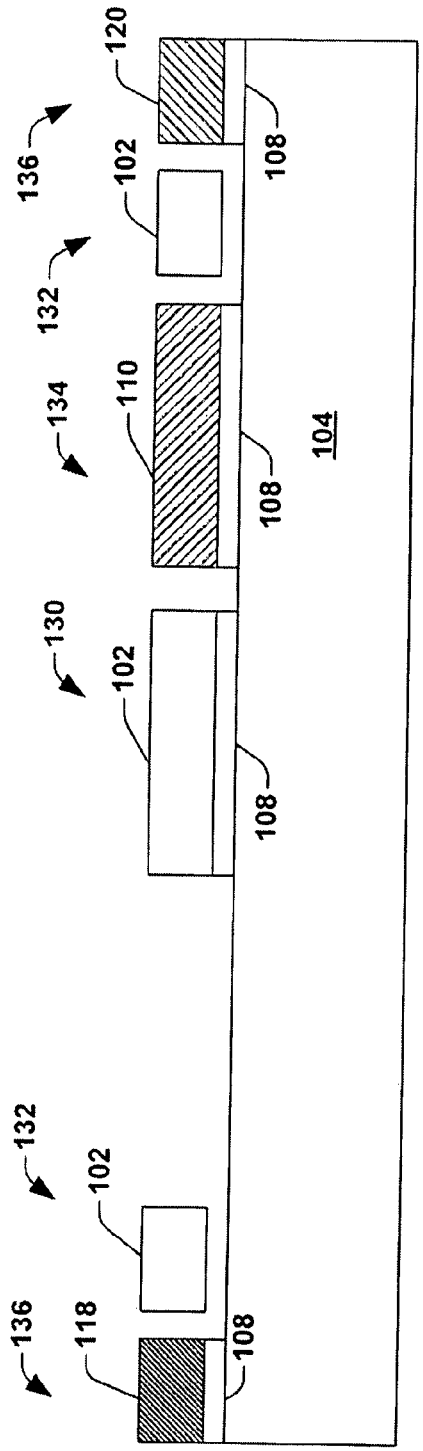
FIG. 4A
FIG. 4B

INTEGRATED BINARY PHASE SHIFT KEYING WITH SILICON MEMS RESONATORS

FIELD OF INVENTION

The present invention relates generally to micro-electromechanical devices, and more particularly to a system and method of using a MEMS resonator for binary phase shift keying.

BACKGROUND OF THE INVENTION

There are three major classes of digital modulation techniques used for transmission of digitally represented data: amplitude shift keying (ASK), frequency shift keying (FSK), and phase shift keying (PSK). All the above digital modulation techniques convey data by changing some aspect of a base signal, the carrier signal, in response to a data signal. In the case of phase shift keying, the phase is changed to represent the content of the data signal. Therefore phase shift keying (PSK) is a digital modulation scheme that conveys data by changing, or modulating, the phase of a reference signal, which is sometimes referred to as a carrier signal.

Any digital modulation scheme uses a finite number of distinct signals to represent digital data. In the case of phase shift keying, a finite number of phases are used. Each of these phases is assigned a unique pattern of binary bits. Usually each phase encodes an equal number of bits. Each pattern of bits forms the symbol that is represented by the particular phase. A demodulator, which is designed specifically for the symbol set used by the modulator, determines the phase of the received signal, and maps the phase back to the symbol it represents, thus recovering the original data. This requires the receiver to be able to compare the phase of the received signal to a reference signal.

One convenient way to represent PSK schemes is on a constellation diagram. A constellation diagram shows the points in the Argand plane wherein the real and imaginary axes are termed the in-phase and quadrature axes respectively, due to their ninety degrees phase separation. Such a representation on perpendicular axes lends itself to straightforward implementation. The amplitude of each point along the in-phase axis is used to modulate a cosine (or sine) wave and the amplitude along the quadrature axis to modulate a sine (or cosine) wave.

In PSK, the constellation points chosen are usually positioned with uniform angular spacing around a circle. This gives maximum phase separation between adjacent points and thus the best immunity to corruption. They are positioned on a circle so that they can all be transmitted with the same energy. In this way, the moduli of the complex numbers they represent will be the same and thus so will the amplitudes needed for the cosine and sine waves. Two common examples are binary phase shift keying (BPSK), which uses two phases, and quadrature phase shift keying (QPSK), which uses four phases. Since the data to be conveyed are usually binary, the PSK scheme is usually designed with the number of constellation points being a power of two (2).

Owing to the simplicity of PSK, it is widely used in many existing technologies. For example, one popular wireless LAN standard, IEEE 802.11b uses a variety of different PSKs depending on the data rate that is required. BPSK is often employed for low cost transmitters, and is used in RFID standards such as ISO 14443, which has been adopted for biometric passports, credit cards, and other applications.

BPSK is the simplest form of PSK. It uses two phases which are separated by 180 degrees, and so is sometimes also referred to as 2-PSK. It does not particularly matter exactly where the constellation points are positioned, and in FIG. 1 they are shown on the real axis, at 0 degrees and 180 degrees, respectively. This modulation is the most robust of all PSKs, since it takes serious distortion to make the demodulator reach an incorrect decision.

One conventional circuit solution for modulating signal data onto a carrier signal is illustrated in FIG. 2. FIG. 2 illustrates a phase locked loop circuit 20, having a phase detector 22, a loop filter 24, a voltage controlled oscillator 26, and a divide by "n" circuit 28. The phase detector 22 compares a reference frequency signal ($f_{ref}$), for example, from a quartz oscillator with a feedback signal. Based on the phase comparison, the phase detector 22 generates an output signal to the loop filter 24, which generates a voltage control signal in response thereto. The voltage controlled oscillator receives the voltage control signal and generates an output frequency ($f_{out}$) in response to the control signal, and provides such output frequency signal to the divider circuit 28 in a feedback loop of the circuit 20. The divider circuit divides down the output frequency signal and provides such divided-down signal back to the phase detector 22. Data is modulated onto the output frequency signal, in one example, by altering the divider value in the divider circuit 28 based on the desired data. This causes the feedback signal back to the phase detector to contain signal information which causes the output of the phase detector 22 to have differing comparison results based on the signal data. In the above manner, the signal data can be modulated onto the carrier signal, wherein the resultant modulated carrier signal is at the output of the VCO.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment, a modulator is disclosed and comprises a micro-electromechanical resonator device configured to receive an input signal and generate two output signals in response thereto. The two generated signals having a predetermined phase relationship therebetween. The modulator further comprises a switching circuit configured to selectively pass one of the two signals to an output of the modulator in response to phase modulation data.

In one embodiment, the micro-electromechanical resonator structure comprises a free standing resonator structure anchored to a semiconductor body, and an input structure configured to urge the free standing resonator structure rotationally about an axis point. The resonator structure further comprises, in one embodiment, a variable capacitor having a capacitance that is a function of a rotational position of the free standing structure with respect to the axis point.

In one embodiment of the invention, a method of modulating a signal is disclosed, and comprises providing an input signal, and rotating a micro-electromechanical resonator structure about an axis as a function of the input signal. The method further comprises sensing a change in capacitance of a capacitive element as a function of the rotation of the micro-electromechanical resonator structure, and generating an output signal as a function of the change in capacitance.

The following description and annexed drawings set forth in detail certain illustrative aspects and implementations of the invention. These are indicative of only a few of the various ways in which the principles of the invention may be employed.

BRIEF DESCRIPTION OF THE DRAWINGS

FIG. 4A is a cross section diagram of the silicon microelectromechanical resonator structure taken along line 4A-4A, according to one embodiment of the invention;

FIG. 4B is a cross section diagram of the silicon microelectromechanical resonator structure taken along line 4B-4B, according to one embodiment of the invention;

DETAILED DESCRIPTION OF THE INVENTION

Figure 1:
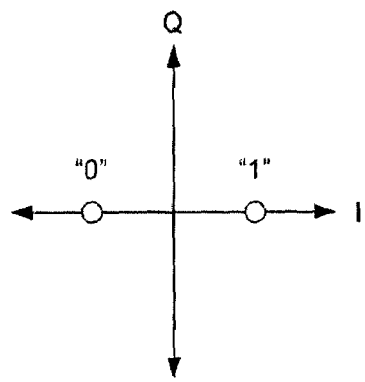
FIG. 1 is a constellation diagram of binary phase shift keying.
Figure 2:
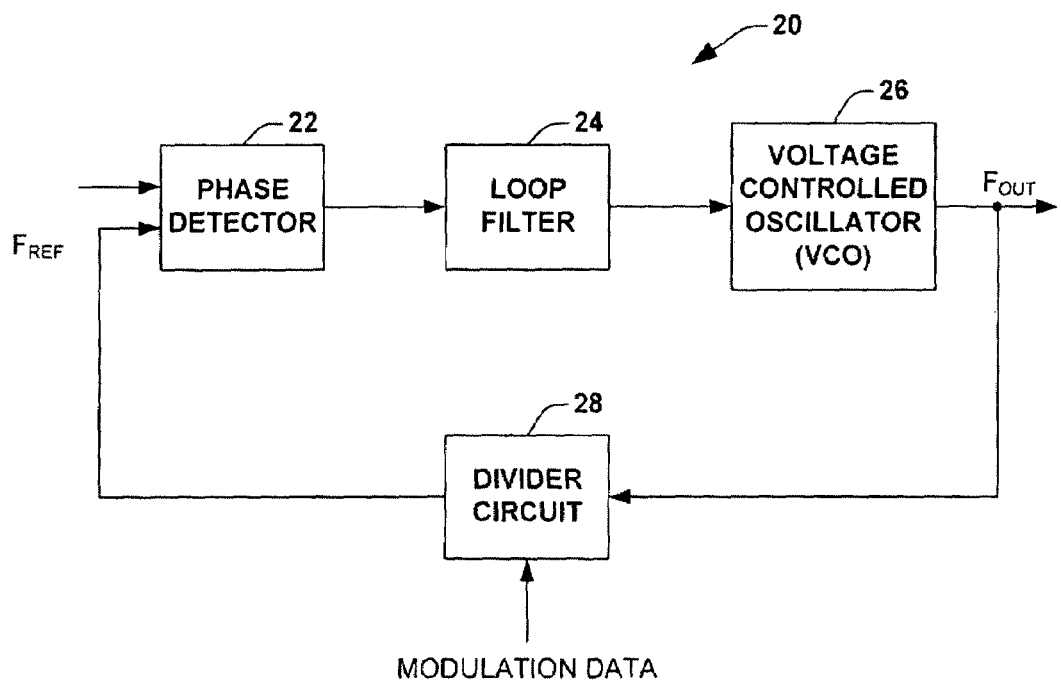
FIG. 2 is a block diagram illustrating a conventional phase locked loop for phase modulation of a signal.

One or more implementations of the present invention will now be described with reference to the attached drawings, wherein like reference numerals are used to refer to like elements throughout. The invention relates to systems and methods for generating signals for use in modulation, such as binary phase shift keying.

Figure 3:
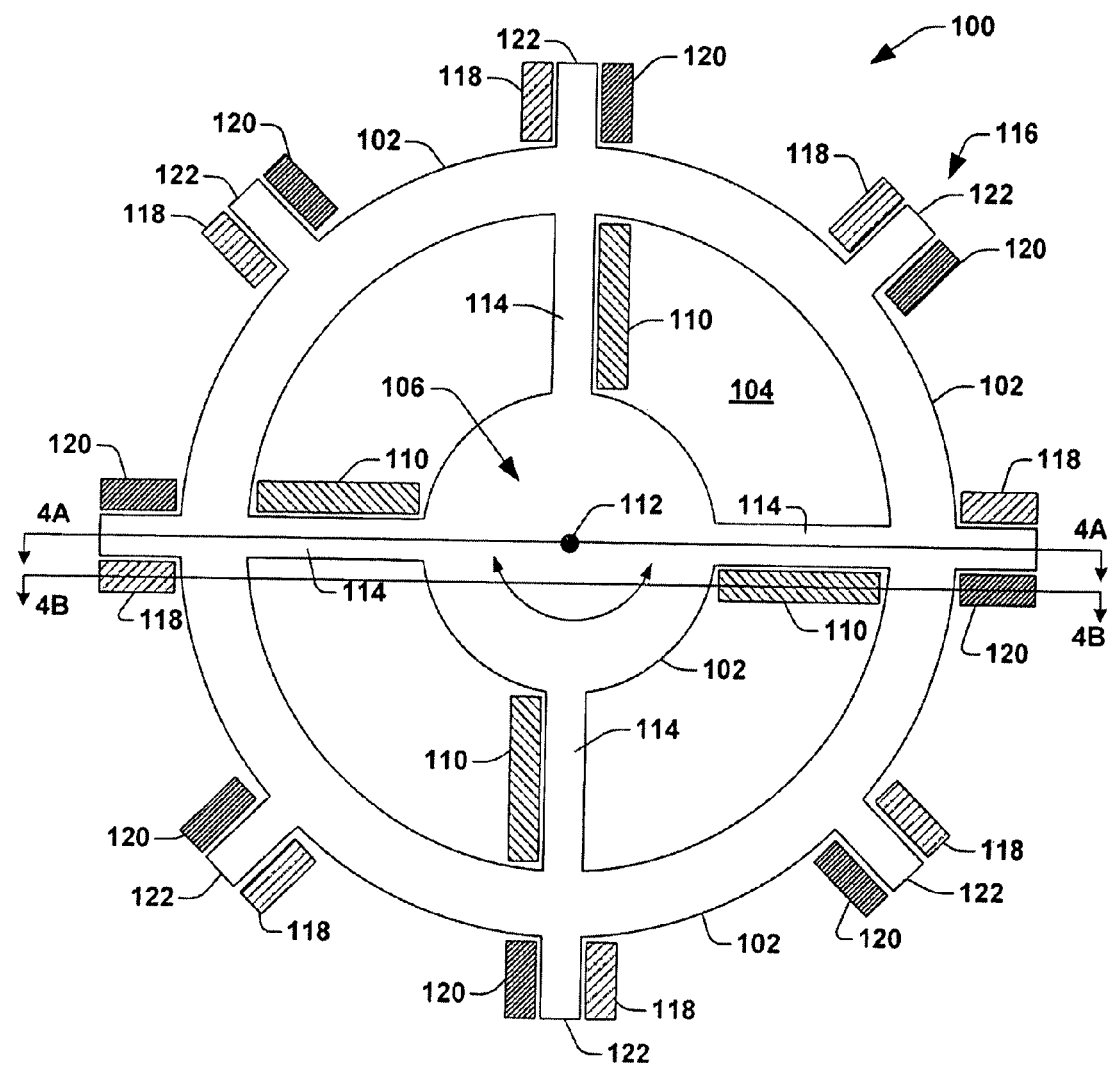
FIG. 3 is a plan diagram illustrating a silicon micro-electromechanical resonator structure according to one embodiment of the invention.

Turning now to FIG. 3, FIG. 3 is a plan view illustrating a silicon micro-electromechanical (MEMS) resonator device 100 according to one embodiment of the invention. While the MEMS resonator device 100 will be described herein with specified materials and various elements as one example, it should be understood that many variations of materials and features can be made, and all such variations are contemplated as falling within the scope of the present invention.

In one embodiment, the MEMS resonator device 100 comprises a free standing resonator structure 102 that is anchored to a semiconductor body 104 lying thereunder. In one embodiment, the resonator structure 102 is anchored to the semiconductor body 104 at a central portion 106 via an insulative material disposed therebetween (not shown in FIG. 3). Such an anchoring material is illustrated in FIG. 4A at reference numeral 108, wherein the insulative material is a silicon oxide, in one embodiment.

Still referring to FIG. 3, the MEMS resonator device 100 further comprises an input structure 110 that is configured to urge the free standing resonator structure 102 rotationally about an axis point 112. In one embodiment of the invention, the free standing resonator structure 102 is formed in a wheel-type structure having spokes 114 extending from a central portion 106. Alternatively, the resonator structure 102 may take on various other shapes, and all such alternatives are contemplated as falling within the scope of the invention. Further, in one embodiment the input structure 110 is configured to urge a movement of the resonator structure 102. While in one embodiment the movement may be a rotational movement about an axis, in alternative embodiments the movement may be a bending or compression of a portion or the entire resonator structure 102, and all such alternatives are contemplated as falling within the scope of the invention. In the example configuration of FIG. 3, the input structure 110 comprises one or more input electrodes that are spatially proximate to, but insulated from, the spokes 114 of the resonator structure 102. In one embodiment the insulation comprises an air gap.

In one embodiment of the invention, each spoke 114 of the resonator structure 102 has an input electrode of the input structure proximate thereto, and each of the input electrodes are electrically coupled together in parallel. The input structure 110 is configured to receive an input signal, wherein such signal results in the application of an electrostatic force on each spoke 114 of the resonator structure 102. Further, such electrostatic force has a magnitude and direction that is a function of the input signal. Consequently, with application of a sinusoidal input signal, a time-varying force will be exerted on the spokes of the resonator structure 102, causing the resonator structure to rotate back and forth a short distance about the axis 112. Due to the insulating portion 108 anchoring the free standing resonator structure 102 to the semiconductor body 104, the amount the resonator structure 102 can rotate is rather limited; nevertheless the resonator structure 102 rotates about the axis 112 as a function of the input signal applied to the input structure 110.

Still referring to FIG. 3, the resonator structure 102 further comprises an output structure 116 that in one embodiment comprises capacitive elements to form a capacitive element pair. In one embodiment the output structure 116 comprises first and second conductive members 118, 120 that form first capacitor plates of the respective capacitive elements. A portion 122 of the free standing resonator structure 102, for example, a radially extending portion as illustrated in FIG. 3, forms a second capacitive plate for each of the capacitive elements. More particularly, for each portion of the output structure 116, one capacitive element comprises features 118 and 122, while a complementary capacitive element comprises the features 120 and 122.

Each capacitive element (118, 122 and 120, 122) has a capacitance associated therewith that is a function of the distance between the respective capacitor plates. Consequently, as the free standing resonator structure 102 rotates about the axis 112 due to the input signal provided to the input structure 110, the distance between the capacitor plates varies, thus altering the capacitance of the capacitive elements. Further, as can be appreciated by the structure of FIG. 3, as the distance between the plates 118 and 122 decreases, the distance between the plates 120 and 122 increases, and vice-versa. This results in the capacitance of the capacitive elements in each pair increasing and decreasing, respectively.

As shown in the embodiment of FIG. 3, multiple output portions 116 may be provided, but are not required. One advantage of having multiple output portions 116 is that each first conductive member 118 can be connected together in parallel, while each second conductive member 120 can be connected in parallel. Therefore the respective capacitive elements can be coupled together in parallel to provide a larger effective capacitance, as may be appreciated.

Turning now to FIGS. 4A and 4B, cross section diagrams of the MEMS resonator device 100 are shown taken along lines 4A-4A and 4B-4B of FIG. 3, respectively. Initially, referring to FIG. 4A, a semiconductor body 104 serves as a base substrate according to one embodiment. The free standing resonator structure 102 overlies, but does not physically contact those portions of the semiconductor body 104 that are not in the center portion 106. At the center portion 106, the insulative material 108 serves to anchor the free standing resonator structure 102 thereat such that the resonator structure 102 rotates about such point, thereby forming the rotation axis 112.

Referring to FIG. 4B, the resonator structure 102 still resides in a middle portion 130, as well as at side portions 132 that correspond to an outer portion of the wheel-like structure of FIG. 3. The input structure 110 resides at an intermediate location 134 and runs along a spoke portion 114 of the resonator structure 102 (not shown in FIG. 4B), and is isolated from the semiconductor body 104 by an insulating material, such as the oxide material 108. First capacitor plates 118, 120 of the respective capacitive elements reside at a distal portion 136 of the resonator structure 102, and run alongside the outer portions 122 thereof that form the second capacitor plate of the respective capacitive elements.

In one embodiment the resonator structure 102 can be formed according to MEMS and/or semiconductor manufacturing techniques. In one embodiment a silicon-over-insulator (SOI) starting material workpiece is patterned, wherein the resonator structure 102 comprises the overlying silicon material and the oxide 108 is the embedded insulative layer. Subsequently, the exposed oxide material is etched, leaving material 108 at the center portion 130. In one embodiment, the input and output structures 110 and 116 are patterned in the overlying silicon concurrently with patterning of the resonator structure 102. Alternatively, after patterning the resonator structure 102, a conductive layer may be deposited and patterned to form the input structures 110 and output structures 116, respectively. Therefore the various conductive structures may comprise silicon, silicide, or a metal. After patterning to form the resonator device 100, a cap may be formed thereover to environmentally protect the finished resonator device 100.

While the above discussion provides one embodiment of how the MEMS resonator device 100 can be manufactured, it should be understood that a plethora of alternative manufacturing techniques exist to generate such a structure, and all such alternatives are contemplated as falling within the scope of the present invention.

Figure 5:
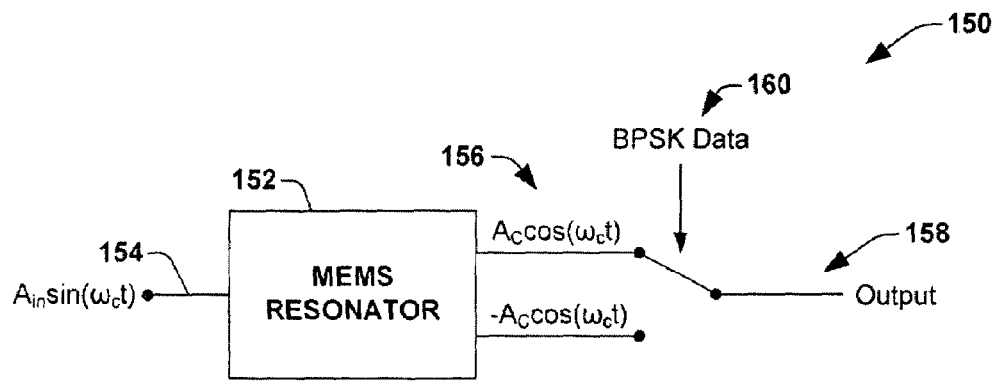
FIG. 5 is a block diagram illustrating a micro-mechanical resonator device employed with a switching system for use in binary phase shift keying according to one embodiment of the invention.

Turning now to FIG. 5, a block diagram is provided illustrating a binary phase shift keying (BPSK) modulator 150 according to one embodiment of the invention. The BPSK modulator 150 comprises a MEMS resonator 152 that receives an input signal $A_{in} \sin(\omega_c t)$ at an input 154 thereof. In one embodiment the MEMS resonator 152 may comprise a MEMS resonator device 100 similar to that illustrated and described in conjunction with FIG. 3. The MEMS resonator 152 is operable to receive a sinusoidal input signal and generate two sinusoidal output signals 156 that have a predetermined phase relationship therebetween. In accordance with BPSK, the predetermined phase relationship is 180 degrees. In one embodiment the two output signals are $A_c \cos(\omega_c t)$ and $-A_c \cos(\omega_c t)$, wherein a phase shift occurs between the input and outputs, and due to losses, the output signal amplitude $A_c$ is less than the input signal amplitude $A_{in}$.

In one embodiment of the invention, the output signals 156 represent a voltage that reflects the change in charge of the respective capacitive elements based on their respective changes in capacitance as the resonator structure 102 rotates. Alternatively, a transformation circuit may be employed to generate the two output signals 156 based on the change in capacitance.

Note that due to the inherent structure of the resonator structure 102 of FIG. 3, as one capacitive element experiences an increase in capacitance, the complementary capacitive element decreases in capacitance in the same manner and at the same rate, thereby resulting in two signals 156 being 180 degrees out of phase with one another. Consequently, the resonator structure 102 avoids the need for any phase adjustment or offset compensation circuitry to ensure the desired phase relationship.

Still referring to FIG. 5, the modulator 150 comprises a switching system 158 that is configured to selectively pass one of the two output signals 156 to an output of the modulator in response to phase modulation data 160. Any form of switching circuitry, or multiplexing circuitry, or MEMS structure may be employed and all such alternatives are contemplated as falling within the scope of the present invention. More particularly, based on the content of the modulation data 160, the switching system 158 selectively passes one of the two output signals 156 to the modulator output. Therefore according to the desired BPSK modulation, the output will comprise an output signal in which the phase thereof will be indicative of the data content.

Figure 6:
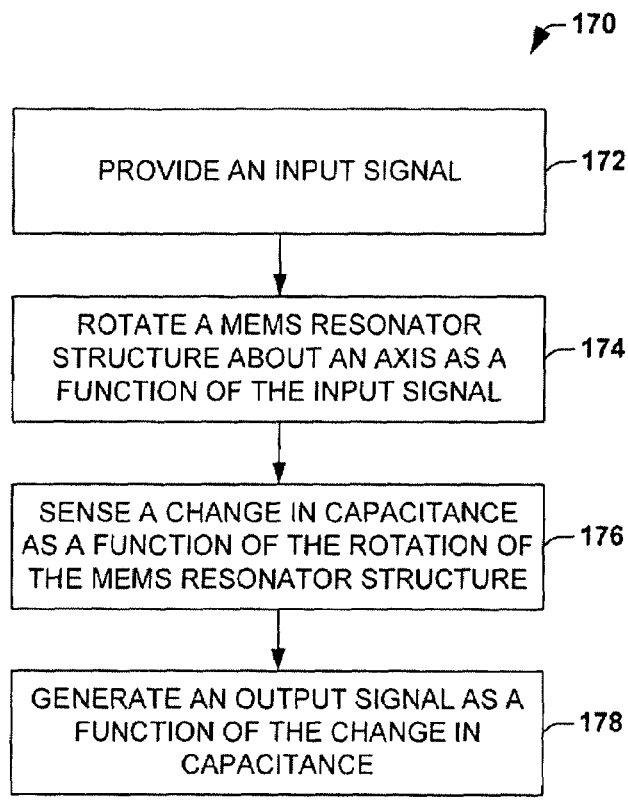
FIG. 6 is a flow chart diagram illustrating a method of generating a signal for use in phase modulation using a microelectromechanical resonator structure according to one embodiment of the invention.

Turning now to FIG. 6, a method of modulating a signal is provided, as illustrated at reference numeral 170. While the method 170 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

The method 170 beings at 172 with the provision of an input signal. At 174 a MEMS resonator structure rotates or otherwise moves about an axis as a function of the provided input signal. More generally, at 174 the MEMS resonator structure exhibits a movement as a function of the input signal, and such movement may be rotation in one embodiment, but may also include a bending or compression of a portion thereof in alternative embodiments. Any form of movement of the MEMS structure may be performed at 174 and all such alternatives are contemplated as falling within the scope of the invention. In one embodiment the rotation of the MEMS resonator structure comprises coupling the input signal to an input structure that is operable to exert a force on a portion of the resonator structure as a function of the input signal.

The method 170 continues at 176 with sensing a change in capacitance of a capacitive element associated with the MEMS resonator structure as a function of the rotation thereof. Since the rotation of the MEMS resonator structure is a function of the input signal, the sensed change in capacitance is also a function of the input signal, as may be appreciated.

The method 170 concludes with the generation of an output signal based on the change in capacitance. In one embodiment the output signal comprises two signals that are 180 degrees out of phase with one another. The output signal is generated with an output structure that is associated with the MEMS resonator structure. In one embodiment the output structure comprises elements that comprise a first plate of a complementary capacitive element pair. In such case a portion of the MEMS resonator structure comprises a second plate of the complementary capacitive element pair. In the above manner, as the MEMS resonator structure rotates about the axis, the distance between the plates of the complementary capacitive element pair changes in a complementary fashion, wherein one element has a capacitance that increases while the other elements experiences a decrease in capacitance.

After generating the two output signals, one of the two output signals is then selectively passed to an output of the modulator as a function of the BPSK modulation data. In the above fashion, the resultant output signal contains phase information that reflects the modulation data.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A modulator, comprising:
   a micro-electromechanical resonator device configured to receive an input signal and generate first and second output signals in response thereto, the first and second output signals having a predetermined phase relationship therebetween; and
   a switching system configured to selectively pass one of the first and second output signals to an output of the modulator in response to phase modulation data.

2. The modulator of claim 1, wherein the predetermined phase relationship comprises 180 degrees.

3. The modulator of claim 1, wherein the micro-electromechanical resonator device comprises:
   a free standing resonator structure anchored to a semiconductor body;
   an input structure configured to urge a movement of the free standing resonator structure; and
   a variable capacitor having a capacitance that is a function of a position of the free standing structure.

4. The modulator of claim 3, wherein the input structure comprises an electrode associated with the free standing resonator structure, and wherein the input structure is configured to exert a force thereon sufficient to cause the free standing resonator structure to move.

5. The modulator of claim 3, wherein the variable capacitor comprises a first electrode substantially spatially fixed with respect to the semiconductor body, and a second electrode configured to move with the free standing resonator structure, wherein the movement of the free standing resonator structure results in a spacing between the first and second electrodes to change, thereby resulting in a change in capacitance that is a function of the position of the free standing resonator structure.

6. A micro-electromechanical resonator structure, comprising:
   a free standing resonator structure overlying a semiconductor substrate and anchored thereto;
   an input signal structure configured to receive an input signal and exert a force on the free standing resonator structure as a function thereof, thereby causing the free standing resonator structure to move; and
   an output signal structure configured to generate first and second output signals having a predetermined phase relationship therebetween as a function of the movement of the free standing resonator structure.

7. The resonator structure of claim 6, wherein the free standing resonator structure comprises a semiconductor member fixedly coupled to the semiconductor substrate via an insulative member at an anchor position, and overlying and not contacting the semiconductor substrate at positions not corresponding to the anchor position.

8. The resonator structure of claim 6, wherein the input signal structure comprises a conductive electrode in proximity to, but electrically insulated from, the free standing resonator structure, wherein the input signal applied thereto is a time-varying signal and results in a time-varying force exerted on the free standing resonator structure, thereby causing the free standing resonator structure to move back and forth.

9. The resonator of claim 8, wherein the free standing resonator structure comprises a plurality of semiconductor members extending from an anchor point at which the free standing resonator structure anchors to the semiconductor body, and wherein the input signal structure comprises a plurality of conductive electrodes coupled together in parallel that each extend along a respective semiconductor member of the free standing resonator structure, wherein the time-varying input signal applied thereto results in a time-varying force exerted on the free standing resonator structure at each of the semiconductor members, thereby causing the free standing resonator structure to move back and forth.

10. The resonator of claim 6, wherein the output signal structure comprises a conductive member in proximity to, but electrically insulated from, a portion of the free standing resonator structure, thereby forming first and second capacitor plates having a distance therebetween that varies, and thus a capacitance that varies, as the free standing resonator structure moves.

11. The resonator of claim 10, wherein the output signal structure further comprises a plurality of conductive members in proximity to, but electrically isolated from, various respective portions of the free standing resonator structure, wherein the plurality of conductive members are connected together in parallel, and together form a plurality of capacitors coupled together in parallel, wherein each contributes to the capacitance that varies as the free standing resonator structure moves.

12. The resonator of claim 6, wherein the output signal structure comprises two conductive members in proximity to, but electrically insulated from, and on opposing sides of a portion of the free standing resonator structure, thereby forming first capacitor plates of two different capacitors, and wherein the portion of the free standing resonator structure forms a second capacitor plate for the two different capacitors, and wherein each of the two different capacitors have a distance between the respective first and second capacitor plates that varies, and thus a capacitance that varies, as the free standing resonator structure moves.

13. A modulator, comprising:
a micro-electromechanical resonating means operable to receive an input signal and generate first and second output signals having a predetermined phase relationship therebetween; and
switching means operable to selectively pass one of the first and second output signals to an output of the modulator in response to a modulation data signal.

14. The modulator of claim 13, wherein the modulation data signal comprises data to be modulated onto a carrier signal.

15. The modulator of claim 13, wherein the input signal comprises a sinusoidal signal, and wherein the two generated signals comprise sinusoidal signals that are 180 degrees out of phase with one another.

16. The modulator of claim 13, wherein the micro-electromechanical resonating means comprises a moving means anchored to a semiconductor body via an insulating portion, wherein the moving means overlies, but does not contact the semiconductor body at portions thereof not overlying the insulating portion.

17. The modulator of claim 16, wherein the micro-electromechanical resonating means further comprises input means spatially proximate to, but insulated from, the moving means, wherein the input means is operable to receive the input signal and exert a force on the moving means in response thereto, thereby causing the moving means to move as a function of the input signal.

18. The modulator of claim 17, wherein the micro-electromechanical means further comprises output means spatially proximate to, but insulated from, the moving means, wherein the output means comprises first and second conducting elements on opposing sides of a portion of the moving means, and wherein the conducting elements form respective first plates of respective capacitances, and the moving means portion therebetween forms a respective second plate of the respective capacitances, and wherein a distance resides between the first and second plates of the respective capacitances, and wherein a movement of the moving means as a function of the input signal results in a change in the distance in the respective first and second plates, and thus a change in the capacitance of the respective capacitances as a function of the input signal.

19. The modulator of claim 18, wherein the change in one of the respective capacitances is opposite the change in the other of the respective capacitances.

20. A method of modulating a signal, comprising:
providing an input signal;
moving a micro-electromechanical resonator structure as a function of the input signal;
sensing a change in capacitance of a capacitive element as a function of the movement of the micro-electromechanical resonator structure; and
generating an output signal as a function of the change in capacitance;
wherein the output signal comprises two output signals having a predetermined phase relationship therebetween, and further comprising selectively passing the two output signals to a modulator output based on a state of a phase modulation signal.

21. The method of claim 20, wherein moving the resonator structure comprises:
coupling the input signal to an input structure operably associated with the resonator structure, wherein the input signal results in a force to be exerted on the resonator structure; and
moving the resonator structure as a function of the input signal.

22. The method of claim 20, wherein sensing a change in capacitance comprises:
forming an output structure operably associated with a portion of the resonator structure, wherein the output structure comprises a first plate of the capacitive element and the portion of the resonator structure comprises a second plate of the capacitive element, wherein a distance exists therebetween that affects the capacitance thereof;
sensing the change in capacitance as a function of the change in the distance between the first and second plates of the capacitive element as the resonator structure moves as a function of the input signal.

23. The method of claim 20, wherein sensing the change in capacitance comprises:
forming an output structure operably associated with a portion of the resonator structure, wherein the output structure comprises two elements disposed on opposing sides of a portion of the resonator structure, and wherein each of the two elements comprise a first plate of respective capacitive elements, and the portion of the resonator structure therebetween comprises a second plate of the respective capacitive elements with respective distances therebetween; and
sensing the change in capacitance as a function of a change in the respective distances between the first and second plates of the respective capacitive elements as the resonator structure moves.

24. The method of claim 23, wherein generating the output signal comprises generating two output signals as a function of the change in capacitance in the respective capacitive elements, wherein as the resonator structure moves in one direction one of the capacitive elements experiences an increase in capacitance while the other one of the capacitive elements experiences a decrease in capacitance, and wherein as the resonator structure moves in the opposite direction the one of the capacitive elements experiences a decrease in capacitance while the other one of the capacitive elements experiences an increase in capacitance.

* * * * *